United States Patent [19]

Swift et al.

[11] 4,287,480

[45] Sep. 1, 1981

[54] PHASE LOCKED LOOP OUT-OF-LOCK DETECTOR

[75] Inventors: Billy K. Swift; Anthony F. Zizzo, both of Phoenix; Willard A. Blevins, Glendale, all of Ariz.

[73] Assignee: Sperry Corporation, New York, N.Y.

[21] Appl. No.: 111,134

[22] Filed: Jan. 10, 1980

[51] Int. Cl.³ .............................................. H03L 7/10
[52] U.S. Cl. ..................................... 331/1 A; 331/14; 331/25; 331/DIG. 2
[58] Field of Search .................. 331/DIG. 2, 1 A, 14, 331/18, 25

[56] References Cited

U.S. PATENT DOCUMENTS

| | | | |
|---|---|---|---|
| 3,956,710 | 5/1976 | Seitz et al. | 331/1 A |
| 3,982,190 | 9/1976 | Schaefer | 331/25 X |
| 3,988,696 | 10/1976 | Sharpe | 331/1 A |
| 4,011,520 | 3/1977 | Schaefer | 331/14 |

*Primary Examiner*—Siegfried H. Grimm
*Attorney, Agent, or Firm*—Howard P. Terry; Richard J. McGrath

[57] ABSTRACT

The out-of-lock condition of a digital phase locked loop is detected during a plurality of states such that single bit discrepancies, such as a noise pulse, are ignored, and thus the tolerable range of phase detection error is broadened. The present invention is adaptable for use with typical applications of digital phase locked loops, and can be used to control the phase detector of the digital phase locked loop such that error voltages will be introduced into the loop only during selected states.

5 Claims, 4 Drawing Figures

PHASE LOCKED LOOP OUT-OF-LOCK DETECTOR

BACKGROUND OF THE INVENTION

1. Field of the Invention

The present invention relates to digital phase locked loop control devices, and more specifically to an out-of-lock detector for use in conjunction with a phase detector in a digital phase locked loop.

2. Description of the Prior Art

Phase locked loops are well known in the prior art, and the digital phase locked loop basically includes a phase detector, a voltage controlled oscillator, and a frequency divider. The phase detector receives a stable reference frequency signal from an external source and an output signal from the voltage controlled oscillator. The phase detector continuously compares the phase of the stable reference frequency signal to the phase of the voltage controlled oscillator output signal whereby the output signal of the phase detector is a measure of the phase differences between the two input signals. If there is a phase difference, the phase detector causes an error voltage to be applied to the voltage controlled oscillator. The voltage controlled oscillator output signal varies in response to the error voltages until the frequency of the voltage controlled oscillator output signal is exactly equal to the average frequency of the stable reference frequency signal. Whenever the phase detector continuously compares two in phase input signals, i.e., the stable reference frequency signal and the voltage controlled oscillator output signal, the phase lock loop is said to be locked. If phase differences between the voltage controlled oscillator's output signal and the stable reference frequency signal reoccur at the phase detector, the phase locked loop is said to be in an out-of-lock condition, and the phase detector introduces new error voltages until the phase locked loop is once again locked.

It is, therefore, apparent that there is a need to determine when the digital phase locked loop is in an out-of-lock condition. Prior art out-of-lock detectors utilized voltage level sensors which measured the magnitude of the error between the stable reference frequency signal and the voltage controlled oscillator's output signal. When the error between these two signals fell below a predetermined value, there was an in-lock signal indication. These analog devices are inefficient due to their slowness which is caused by the necessity of waiting for the measured analog voltages to settle out. There are digital phase lock detectors that do not include analog voltage level sensors. These phase lock detectors are specifically designed for use with a digital frequency synthesizer, and it is not apparent that these digital phase lock detectors can be easily adapted for use with other phase locked loop designs. The digital frequency synthesizer phase lock detector broadens the range of tolerable phase error over the prior art analog devices, but these digital phase detectors still provide out-of-lock signals when there are insignificant single bit discrepancies, such as a noise pulse, in the signals processed by the phase locked loop.

Accordingly, there is a need for a fast digital phase locked loop out-of-lock detector that is adaptable for use with all typical applications of the digital phase locked loop. Furthermore, there is a need for a digital phase locked loop out-of-lock detector which will ignore signal single bit discrepancies in the signals processed by the digital phase locked loop, and thus effectively further broaden the range of tolerable phase error.

SUMMARY OF THE INVENTION

In accordance with the invention, the aforementioned difficulties with detecting the out-of-lock condition of the digital phase locked loop are to a great extent alleviated through the practice of this invention. Specifically, an embodiment of the invention comprises a phase locked loop out-of-lock detector having a wave shaping means and a sequential logic means. The wave shaping means shapes an input signal into an in-lock window signal and a stable reference frequency signal for application to the digital phase locked loop. The sequential logic means, which is comprised of memory means and combinational logic means, compares the in-lock window signal to an output signal of the digital phase locked loop. Thus, the phase locked loop out-of-lock detector provides an out-of-lock indication signal only under selected conditions, and it is capable of ignoring single bit discrepancies, such as a noise pulse.

DESCRIPTION OF THE PREFERRED EMBODIMENTS

For a more complete appreciation of the invention, attention is invited to the following description of an illustrative embodiment of the invention, as shown in the attached drawings.

Figure 1:
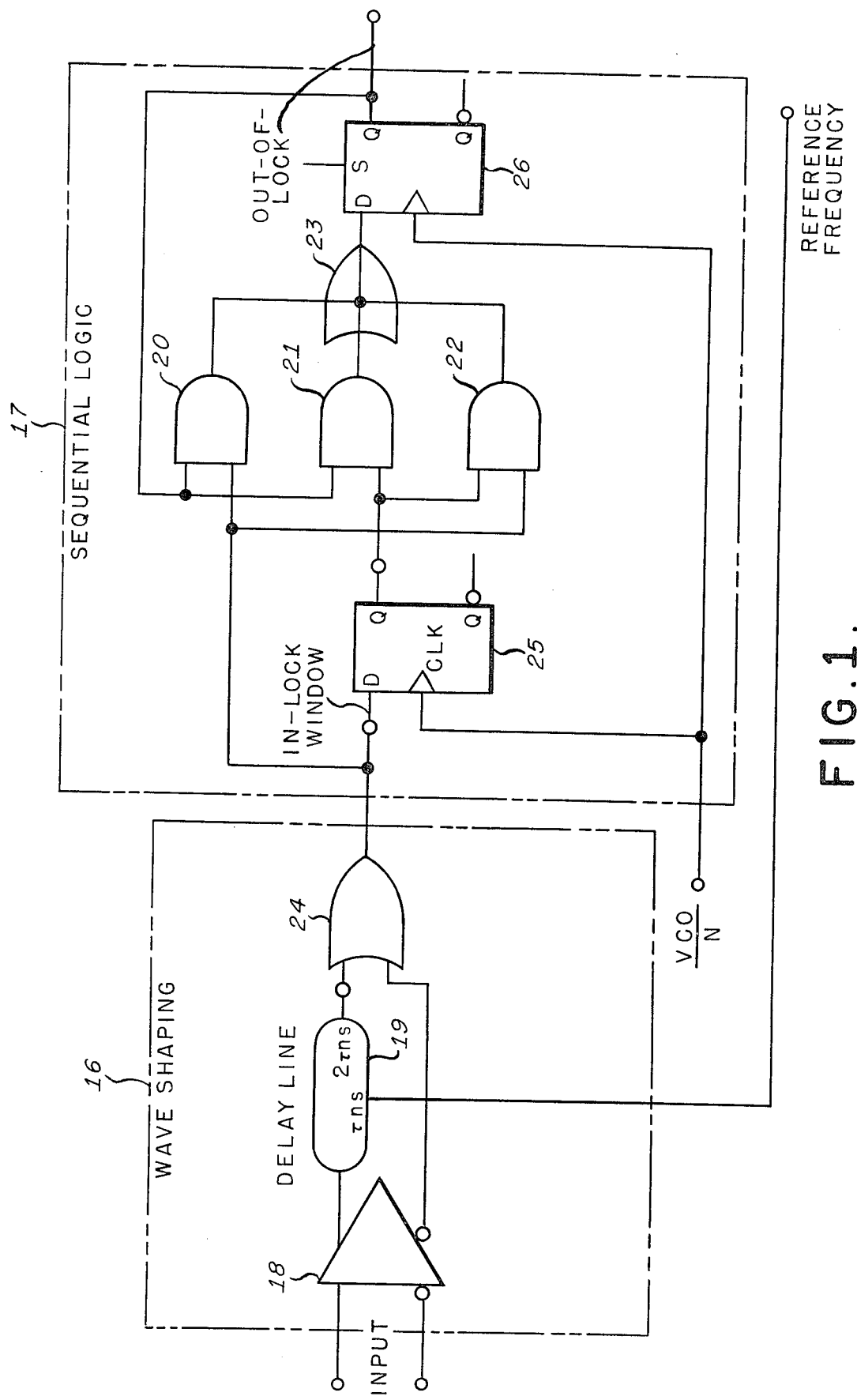
FIG. 1 illustrates a schematic diagram of a preferred embodiment of the phase locked loop out-of-lock detector.

FIG. 1 illustrates a schematic diagram of the out-of-lock detector 11 which includes the wave shaping means 16 and the sequential logic means 17. The wave shaping means 16 may include a buffer 18, a delay line 19 and an OR gate 24. The input terminals of buffer 18 receive an input signal and the output terminals of the buffer 18 are coupled to the delay line 19 and the OR gate 24. The output terminals of the delay line 19 are coupled to a phase detector (not shown) of a digital phase locked loop and the OR gate 24. The output terminal of the OR gate 24 provides an in-lock window signal, and the output terminal is coupled to the sequential logic means 17. The sequential logic means 17 may be comprised of memory means having two D-type flip flops 25 and 26 and combination logic means which may include AND gates 20, 21, and 22 and the wired OR gate 23. The clock terminal of the D-type flip flop 25 and the clock terminal of the D-typ flip flop 26 are coupled to a divided voltage controlled oscillator (VCO/N) output signal. The in-lock window signal from the OR gate 24 is applied to the D input of the D-type flip flop 25, an input terminal of the AND gate 20 and an input terminal of the AND gate 22. The Q output of the D-type flip flop 25 is coupled to an input terminal of the AND gate 21 and an input terminal of the AND gate 22. The output terminals of the AND gates 20, 21 and 22 may be wired together to form an OR gate 23. The output terminal of the OR gate 23 is coupled to the D input of the D-type flip flop 26. The Q output of the D-type flip flop 26 is coupled to an input terminal of the AND gate 20 and also provides an output means for an out-of-lock indication signal.

Figure 2:
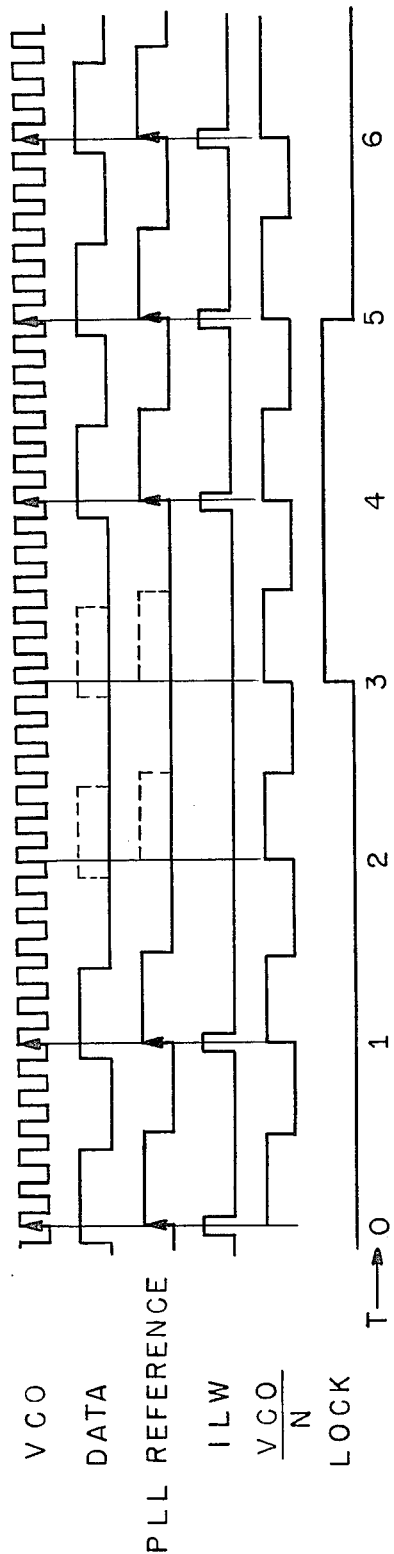
FIG. 2 depicts a timing diagram of a plurality of waveforms helpful in explaining the invention.

FIG. 2 depicts a timing diagram of a plurality of waveforms helpful in explaining the present invention. The waveform designated as VCO is the output signal of a voltage controlled oscillator. The waveform designated DATA is the input signal applied to the out-of-lock detector from an external source, and it should be noted that the DATA signal has two missing pulses which are represented by dotted lines. The waveform designated PLL Reference is an output signal delayed by a time period τ from the delay line 19, and it is a stable reference frequency signal which is applied to a phase detector of a digital phase locked loop. The waveform designated ILW is the in-lock window signal which is an output signal from the out-of-lock detector's wave shaping means. The waveform designated VCO/N is the clock signal which is applied to the D inputs of the D-type flip flops 25, 26, and it is also the divided voltage controlled oscillator output signal. The waveform designated as LOCK is the out-of-lock indication signal provided by the out-of-lock detector.

Figure 3:
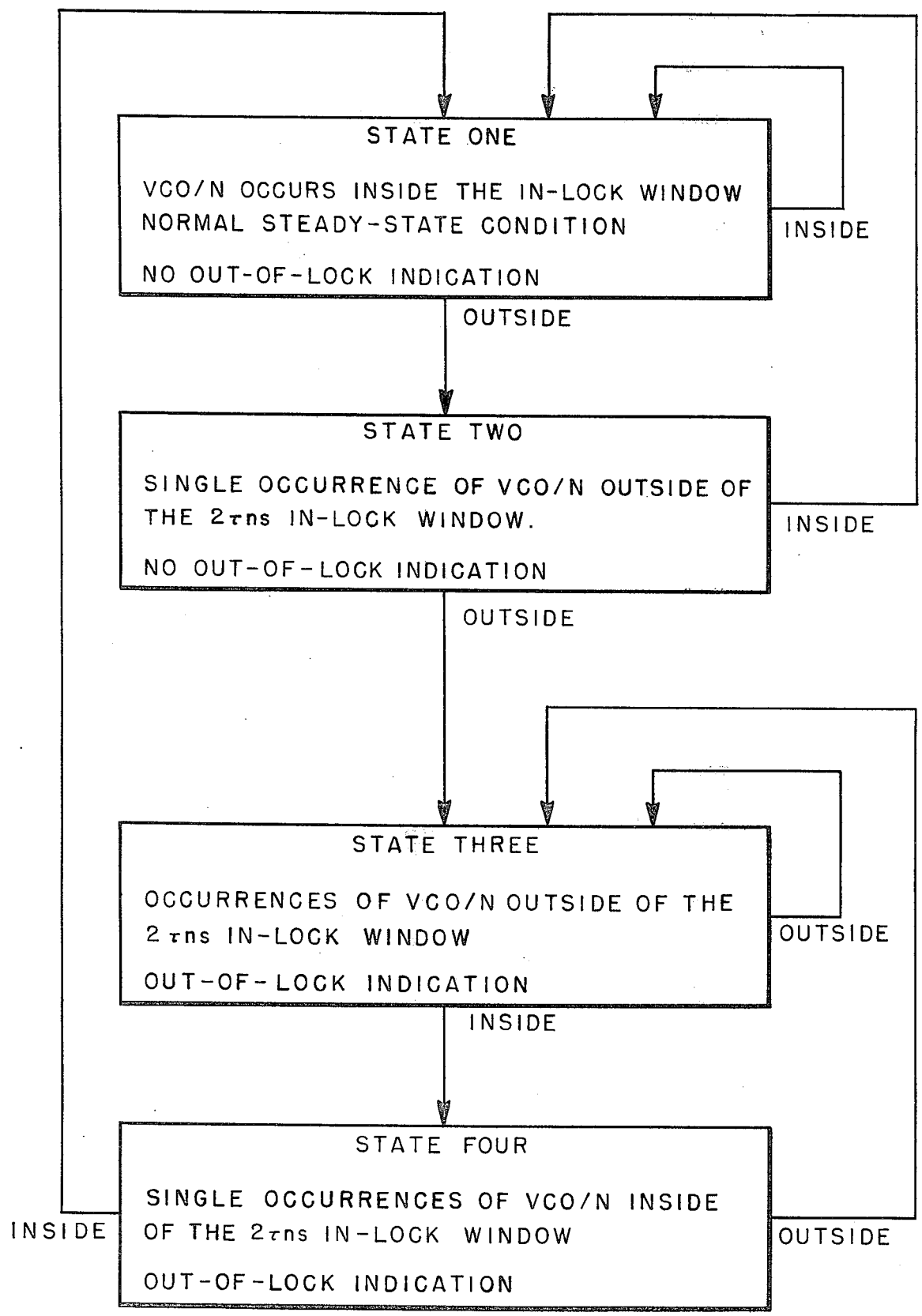
FIG. 3 illustrates a flow diagram of four possible states of sequential logic associated with this invention.

FIG. 3 depicts states of the sequential logic that are associated with the out-of-lock detector 11. The out-of-lock detector 11 compares a rising edge of the VCO/N signal to a positive going pulse of the in-lock window signal and if the rising edge continuously occurs within the in-lock window signal, then the phase locked loop is locked. In state one, the normal steady state condition of the out-of-lock detector 11, the digital phase locked loop is locked. If the next rising edge of the VCO/N signal occurs inside the in-lock window signal, the out-of-lock detector 11 remains in state one. If the rising edge of the VCO/N signal occurs outside the in-lock window signal, the out-of-lock detector 11 goes to state two. In state two, a single occurrence of a rising edge of the VCO/N signal outside the in-lock window signal will not cause an out-of-lock signal indication. If the next rising edge of the VCO/N signal occurs within the in-lock window signal, then the out-of-lock detector 11 returns to state one; if the rising edge of the VCO/N signal occurs outside the in-lock window signal, then the out-of-lock detector 11 goes to state three. In state three the out-of-lock detector signals an out-of-lock indication and this is the normal state of the out-of-lock detector 11 when the phase locked loop is initialized. If the next rising edge of the VCO/N signal occurs outside the in-lock window, the out-of-lock detector 11 remains in state three and continues to signal an out-of-lock condition. If the rising edge of the VCO/N signal occurs inside the in-lock window signal, the out-of-lock detector 11 goes to state four. State four indicates that a single occurrence of a rising edge of the VCO/N signal has occurred inside the in-lock signal. If the next rising edge of the VCO/N signal occurs outside the in-lock window signal, the out-of-lock detector 11 returns to state three; if the rising edge of the VCO/N signal occurs inside the in-lock window signal, then the out-of-lock detector 11 returns to state one, i.e., the steady state condition.

Figure 4:
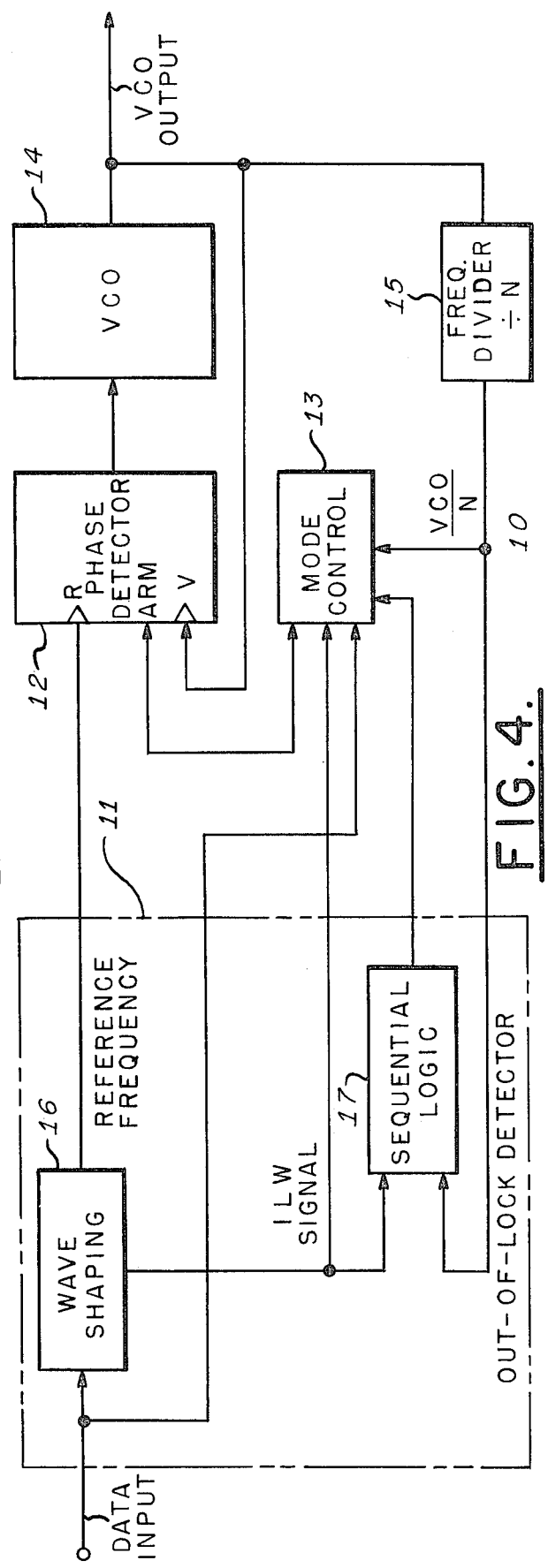
FIG. 4 is a block diagram illustrating the out-of-lock detector coupled to a typical digital phase locked loop.

FIG. 4 is a block diagram illustrating the out-of-lock detector 11 coupled to a typical digital phase locked loop 10. The digital phase lock loop 10 includes a phase detector 12, a voltage controlled oscillator 14, and a frequency divider 15 which are coupled together to form the loop. The phase detector 12 includes a pair of D-type flip flops, i.e., a reference flip flop and a variable flip flop, and a logic means (not shown). This type of phase detector is well known in the art. The phase detector 12 is depicted with two pairs of input terminals which are coupled to the two D-type flip flops contained therein. A mode control unit 13 receives inut signals from at least the out-of-lock detector 11 and the frequency divider 15, and it is coupled to the phase detector 12 for switching the input signals applied to the variable flip flop. The frequency divider 15, which is capable of division by an integer N, is coupled to the sequential means 17 for providing the VCO/N signal. The sequential logic means 17 is coupled to the wave shaping means 16 to receive the in-lock window signal. The wave shaping means 16 is coupled to the phase detector 12 for providing a stable reference frequency signal.

Referring back to FIG. 1, it can be seen that the wave shaping means receives the input DATA signal from an external source. The input DATA signal is buffered and inverted by the amplifier 18. The inverted output signal of amplifier 18 is applied to a delay line 19 and the non-inverted output of the amplifier 18 is applied to the OR gate 24. The inverted buffered input signal applied to the delay line 19 is delayed by some time period τ measured in nanoseconds to provide a first delay line output signal, i.e., the stable reference frequency signal. A second delayed output signal from the delay line 19 is delayed by a time period 2τ and it is applied to the OR gate 24. The OR gate 24 receives the second delayed output signal from the delay line 19 and the non-inverted output signal of the amplifier 18. The output signal of the OR gate 24 is the in-lock window signal. The in-lock window signal is a waveform having periodic positive going pulses which form windows having a fixed time width, i.e., 2τ ns. The fixed time width, however, may be varied to broaden or narrow the tolerable phase error detected by the out-of-lock detector. The in-lock window signal is applied to the sequential logic means 17.

The sequential logic means 17 illustrates in schematic in FIG. 1 receives the in-lock window signal and the VCO/N signal. The D-type flip flop 25 compares a positive going pulse of the in-lock window signal received at the D input to a rising edge of VCO/N signal received at the clock pulse input in order to set the Q output. For example, if at some point in time the D input is pulsed HIGH, then after the triggering transition of the next clock pulse signal, i.e., the next rising edge of the VCO/N signal, there will be an output at the Q output such that Q is HIGH. Similarly, when D is LOW, the next triggering transition signal will set the flip flop 25 such that Q is LOW. The flip flop 26 operates in the same manner as flip flop 25 except that the flip flop 26 compares the output signal of the OR gate 23 with the rising edge of the VCO/N signal. The triggering transition signal from both flip flops 25 and 26 is the VCO/N signal which is applied to their respective clock pulse inputs. The Q output of flip flop 26 provides the out-of-lock indication signal.

When the phase locked loop is locked, the out-of-lock detector 11 assumes a steady state condition. This steady state condition occurs when the rising edge of the VCO/N signal continuously occurs during positive going pulses of the in-lock window signal. When the rising edge of the VCO/N signal does not occur within positive going pulses of the in-lock window signal, the phase lock loop is in an out-of-lock condition. Referring to FIG. 2, it can be seen that there are two missing pulses on the input DATA signal which are depicted by dotted lines. Since the wave shaping means 16 of the out-of-lock detector 11 shapes the input DATA signal into the in-lock window signal, the in-lock window signal is also missing two positive going pulses. Missing pulses or windows on the in-lock window signal would cause an out-of-lock indication, since there would be no windows to compare to the VCO/N signal. The out-of-lock indication would also occur when noise pulses occur in the VCO/N signal, since a rising edge of the VCO/N signal would occur outside of a window. Thus, a single noise pulse or a missing window would cause the out-of-lock detector to indicate an out-of-lock condition, if it was not for the present invention's ability to ignore single bit discrepancies. In many applications of the digital phase locked loop, introducing an error voltage into the loop when a single noise pulse or a missing window occurs, makes for inefficient operation of the loop, and the present invention can solve this problem.

Referring now to FIG. 4, it can be seen that a mode control unit 13 receives the out-of-lock signal provided by the sequential logic means 17 and it can be utilized as means to ignore the single bit discrepancies. The mode control unit 13 which may be a simple switch comprised of logic gates, is capable of switching the input signals provided to the phase detector 12. For example, the mode control unit 13 may switch the variable input to the phase detector 12. Switching the D input variable from the input DATA signal or in-lock window signal to the VCO/N signal is a method for controlling the error voltages introduced into the loop. Thus, the mode control unit 13 will not be switched after a single bit discrepancy and there will be no error voltages introduced into the loop, since there is no out-of-lock indication. The tolerable range of phase error for the phase locked loop 10, therefore, has been further broadened through the practice of the present invention.

Referring again to FIG. 2, it should be noted that each time period in the timing diagram depicted therein can be correlated to a state of sequential logic depicted in FIG. 4 to determine if there will be an out-of-lock indication signalled by the out-of-lock detector 11 and switching by the mode control unit if one is utilized. For example, at T=0 and T=1, the out-of-lock detector 11 is in the steady state, i.e., sequential logic state one, and there is no out-of-lock indication. At T=2, the out-of-lock detector 11 is in sequential logic state two wherein there is no out-of-lock indication. This can be readily confirmed by examining the out-of-lock indication signal, designated LOCK. At T=3, the out-of-lock detector 11 is in sequential logic state three wherein there is an out-of-lock indication signal. This out-of-lock indication signal is represented by the positive going edge of the out-of-lock indication signal LOCK, at the point where T=3. At T=4, the out-of-lock detector 11 is in sequential logic state four wherein there is an out-of-lock indication. T=5, the out-of-lock detector 11 has returned to the sequential logic state wherein there is no out-of-lock indication. The absence of an out-of-lock indication is indicated by the negative going edge of the out-of-lock indication signal designated LOCK, at the point where T=5. The out-of-lock detector 11, therefore, is capable of detecting and signalling the four states of sequential logic illustrated in FIG. 3.

While the invention has been described in its preferred embodiments, it is to be understood that the words which have been used are words of description rather than limitation and that changes within the purview of the appended claims may be made without departing from the true scope and spirit of the invention in its broader aspects.

We claim:

1. A circuit for detecting an out-of-lock condition of a digital phase locked loop, having a phase detector, a voltage controlled oscillator, and a frequency divider, which comprises:

wave shaping means having input terminal means for receiving an input signal, and output terminal means for providing said digital phase locked loop with a window signal having periodic pulses of a fixed time width and a stable reference signal; and sequential logic means coupled to the output terminal means of said wave shaping means and coupled to the output terminal means of said digital phase locked loop, for receiving the window signal from said wave shaping means and the voltage controlled oscillator's output signal from said digital phase locked loop, for detecting the occurrence of an edge of the voltage controlled oscillator's output signal wihin a pulse of the window signal during a plurality of states, and for signalling the existence of selected states in which the edge of the voltage controlled oscillator's output signal does not occur within a pulse of the window signal.

2. A circuit according to claim 1 wherein the sequential logic means includes:
combinational logic means; and
memory means coupled to said combinational logic means.

3. A circuit according to claim 2, wherein said wave shaping means includes:
a buffer having input terminal means and output terminal means,
a delay line having input terminal means coupled to said buffer output terminal means and output terminal means, for providing the stable reference signal, and
an OR gate having input terminal means coupled to said delay line output terminal means and said buffer output terminal means and output terminal means, for providing the window signal.

4. A circuit according to claim 3 wherein said combinational logic means includes
a first AND gate having input terminal means and an output terminal means,
a second AND gate having input terminal means coupled to said first AND gate input terminal means and an output terminal means;
a third AND gate having input terminal means coupled to said first and second AND gate input terminal means, and output terminal means; and
an OR gate having input terminal means coupled to said first, second and third AND gate output terminal means, and an output terminal means.

5. A circuit according to claim 4 wherein the memory means includes:
a first D-type flip flop having input terminal means coupled to said wave shaping means and to the voltage controlled oscillator's output signal provided by said digital phase locked loop and output terminal means coupled to said combinational logic means; and
a second D-type flip flop having input terminal means coupled to said combinational logic means and to the voltage controlled oscillator's output signal and output terminal means for signalling the existence of selected states.

* * * * *